(12) United States Patent
Chu et al.

(10) Patent No.: US 12,666,775 B2
(45) Date of Patent: Jun. 23, 2026

(54) CHIP OF LED AND MANUFACTURING METHOD THEREOF

(71) Applicant: Focus Lightings Tech (Suqian) Co., Ltd., Suqian (CN)

(72) Inventors: Zhiqiang Chu, Suqian (CN); Hao Chen, Suqian (CN); Shikang Qu, Suqian (CN); Zhiqiang Zhang, Suqian (CN); Chuang Ma, Suqian (CN); Jie Gao, Suqian (CN); Zhen Zhang, Suqian (CN); Qian Zhao, Suqian (CN); Hebing Wu, Suqian (CN); Yufei Cao, Suqian (CN)

(73) Assignee: FOCUS LIGHTINGS TECH (SUQIAN) CO., LTD., Suqian (CN)

( * ) Notice: Subject to any disclaimer, the term of this patent is extended or adjusted under 35 U.S.C. 154(b) by 363 days.

(21) Appl. No.: 18/271,363

(22) PCT Filed: May 15, 2023

(86) PCT No.: PCT/CN2023/094235
§ 371 (c)(1),
(2) Date: Jul. 7, 2023

(87) PCT Pub. No.: WO2024/207593
PCT Pub. Date: Oct. 10, 2024

(65) Prior Publication Data
US 2024/0395851 A1      Nov. 28, 2024

(30) Foreign Application Priority Data
Apr. 6, 2023      (CN) .......................... 202310361361.8

(51) Int. Cl.
*H10H 29/14* (2025.01)
*H10H 20/816* (2025.01)
(Continued)

(52) U.S. Cl.
CPC ........ *H10H 29/14* (2025.01); *H10H 20/8162* (2025.01); *H10H 20/831* (2025.01); *H10H 20/833* (2025.01)

(58) Field of Classification Search
CPC .. H10H 29/14; H10H 20/8162; H10H 20/831; H10H 20/833; H10H 20/032; H10H 20/816; H10H 20/01335; H10H 20/825
See application file for complete search history.

(56) References Cited

U.S. PATENT DOCUMENTS 5,923,052 A * 7/1999 Kim ..................... H10H 20/832
257/745
9,484,500 B2 * 11/2016 Kim ..................... H10H 20/831
(Continued)

FOREIGN PATENT DOCUMENTS

| CN | 106935687 A | 7/2017 |
| CN | 112086544 A | 12/2020 |
| CN | 113555476 A | 10/2021 |

OTHER PUBLICATIONS

International Search Report and Written Opinion of the ISA issued in PCT/CN2023/094235, mailed Dec. 21, 2023; ISA/CN.

*Primary Examiner* — Mark W Tornow
(74) *Attorney, Agent, or Firm* — HOWARD M COHN and Associates, LLC

(57) ABSTRACT

A chip of a LED, comprising: a current blocking layer including a first current blocking layer grown along an epitaxial layer and a plurality of second current blocking layers disposed at one end of the first current blocking layer at intervals, the first current blocking layer gradually widens along a direction away from the second current blocking layers; a transparent conductive layer including a first transparent conductive layer and a second transparent conductive layer grown on the epitaxial layer, the first transparent conductive layer is grown on the current blocking layer and
(Continued)

at least partially overlapped with the second current blocking layers; a metal finger electrode having a width gradually narrowed from the first end to the second end thereof and smaller than the width of the first current blocking layer, and the second current blocking layers are distributed around the first end of the metal finger electrode.

9 Claims, 10 Drawing Sheets

(51) Int. Cl.
     H10H 20/831          (2025.01)
     H10H 20/833          (2025.01)

(56)                    References Cited

U.S. PATENT DOCUMENTS

|  |  |  |  |
|---|---|---|---|
| 9,705,035 B1 * | 7/2017 | Huang | H10H 20/833 |
| 9,905,729 B2 * | 2/2018 | Kim | H10H 20/831 |
| 2012/0098009 A1 * | 4/2012 | Kim | H10H 20/01 |
|  |  |  | 257/E33.072 |
| 2013/0146934 A1 * | 6/2013 | Lin | H10H 20/831 |
|  |  |  | 257/99 |
| 2018/0248078 A1 * | 8/2018 | Kuo | H10H 20/831 |
| 2019/0189850 A1 * | 6/2019 | Wang | H10H 20/0137 |

* cited by examiner

53

5

CHIP OF LED AND MANUFACTURING METHOD THEREOF

This application is the national phase of International Application No. PCT/CN2023/094235, titled "CHIP OF LED AND MANUFACTURING METHOD THEREOF", filed on May 15, 2023, which claims priority to Chinese patent application No. 202310361361.8, filed with the China National Intellectual Property Administration on Apr. 6, 2023 and entitled "CHIP OF LED AND MANUFACTUR-ING METHOD THEREOF", which are incorporated herein by reference in their entirety.

FIELD OF THE INVENTION

This application relates to the technical field of light emitting diode (LED), in particular to a chip of a light emitting diode (LED) and a manufacturing method thereof.

BACKGROUND OF THE INVENTION

A related elongated LED (Light Emitting Diode) chip is especially suitable for the display of a mobile phone screen because of its high aspect ratio. In order to ensure the display effect of the mobile phone screen, the light emitting diode mainly uses a thin metal finger electrode made on an epitaxial layer. Although the metal finger electrode can effectively ensure the display effect of the mobile phone screen, due to the thin metal finger electrode, the antistatic ability of the chip will be affected, which will increase a probability of electrostatic breakdown of the chip, thereby affecting the service life of the Light Emitting Diode (LED). That is to say, the metal finger electrode is relatively thin, so when it generates current, the current is relatively concentrated, and it is easy to have breakdown holes in the epitaxial layer, resulting in abnormal light emission of the metal finger electrode. Ultimately, it will affect the service life of the light emitting diode.

In this case, it is necessary to widen the metal finger electrode so as to increase the antistatic capability of the LED chip. However, widening the metal finger electrode would result in sacrificing the brightness of the Light Emitting Diode chip.

Based on the above, there is an urgent need for a Light Emitting Diode (LED) chip that can take into account both the brightness and the antistatic effect of the chip.

SUMMARY OF THE INVENTION

This application provides a chip of a light emitting diode (LED), which is used to solve a problem that the existing LED chip cannot balance the brightness and the antistatic effect.

A first aspect of the present application provides a chip of a light emitting diode (LED), comprising:

a substrate, and an epitaxial layer, a current blocking layer, a transparent conductive layer and a metal finger electrode grown sequentially on the substrate, wherein the current blocking layer includes a first current blocking layer and second current blocking layers, the first current blocking layer is grown along a length direction of the epitaxial layer, the number of the second current blocking layers is multiple, the plurality of second current blocking layers are arranged at one end of the first current blocking layer at intervals, and the plurality of second current blocking layers are arranged and grown in a preset shape;

the first current blocking layer gradually widens along a direction away from the second current blocking layers;

the transparent conductive layer includes a first transparent conductive layer and a second transparent conductive layer, the first transparent conductive layer is grown on the current blocking layer and is at least partially overlapped with the second current blocking layers, and the second transparent conductive layer is grown on the epitaxial layer; and the metal finger electrode is grown on a region of the transparent conductive layer on which current blocking layer is orthographically projected, the metal finger electrode has a first end of the metal finger electrode and a second end of the metal finger electrode opposite to each other, a width of the metal finger electrode gradually narrows from the first end of the metal finger electrode to the second end of the metal finger electrode, the width of the metal finger electrode is smaller than the width of the first current blocking layer, and the second current blocking layers are distributed around the first end of the metal finger electrode.

In some implementations, an end point of the first end of the metal finger electrode is a P electrode pad of a circular or polygonal shape, and a width of the connecting part of the first end of the metal finger electrode and the second end of the metal finger electrode is 2.5~20 um.

In some implementations, the second end of the metal finger electrode is provided with an antistatic part, and a distance between two opposite points of the antistatic part is greater than the width of the metal finger electrode; and a length of two opposite points of the second end of the metal finger electrode is 2.5~6.5 um.

In some implementations, the first transparent conductive layer comprises a hollow conductive ring covering a part of the second current blocking layers, so that the hollow part of the conductive ring can be orthographically projected on a region enclosed by the plurality of second current blocking layers.

In some implementations, the conductive ring includes a plurality of inward recesses, so that the first transparent conductive layer has a plurality of protrusions surrounding the conductive ring, and the protrusions are at least partially grown on the second current blocking layers.

In some implementations, the current blocking layer is made of $SiO_2$ or $Si_3N_4$, and the width of the first current blocking layer is 16.5~50 um.

In some implementations, the surface of the epitaxial layer includes a first epitaxial layer surface and a second epitaxial layer surface, the first epitaxial layer surface is disposed at two adjacent edges of the epitaxial layer, and the second transparent conductive layer is grown on the second epitaxial layer surface; and the current blocking layer further includes a third current blocking layer, wherein an N-type electrode exposed part is grown on the first epitaxial layer surface, the N-type electrode exposed part includes a first N-type electrode exposed part and a second N-type electrode exposed part, the first N-type electrode exposed part is arranged in the length direction of the epitaxial layer, away from the end portion of the epitaxial layer at the first end of the metal finger electrode, and the third current blocking layer is provided at the center of the first N-type electrode exposed part, and the second N-type electrode exposed part is disposed along a width direction of the epitaxial layer.

In some implementations, the chip further comprises an insulating protection layer grown on uncovered regions of the epitaxial layer, the current blocking layer, the transparent conductive layer and the metal finger electrode.

In some implementations, the metal finger electrode includes an adhesion layer, a structural layer and a conductive layer arranged in sequence; wherein the adhesion layer is made of Cr, Ni or Ti;

the structural layer is made of Al, Cr, Ti, Pt or Ni; and the conductive layer is made of Cu, Au, Sn or AuSn.

A second aspect of the present application provides a manufacturing method of a chip of a light emitting diode (LED), which is applied to the chip of the LED described above, the manufacturing method comprising:

growing an epitaxial layer on a substrate;

growing a current blocking layer on the epitaxial layer;

growing a transparent conductive layer on the current blocking layer; and growing a metal finger electrode at an orthographical projection position of the current blocking layer on the transparent conductive layer; wherein, the current blocking layer includes a first current blocking layer and second current blocking layers, the first current blocking layer is grown along a length direction of the epitaxial layer, the number of the second current blocking layers is multiple, the plurality of second current blocking layers are arranged at one end of the first current blocking layer at intervals, and the plurality of second current blocking layers are arranged and grown in a preset shape;

the first current blocking layer gradually widens from one end thereof close to the second current blocking layers to the other end of the first current blocking layer away from the second current blocking layers;

the transparent conductive layer includes a first transparent conductive layer and a second transparent conductive layer, the first transparent conductive layer is grown on the current blocking layer and is at least partially overlapped with the second current blocking layers, and the second transparent conductive layer is grown on the epitaxial layer; and the metal finger electrode is grown on a region of the transparent conductive layer on which the current blocking layer is orthographically projected, and has a first end of the metal finger electrode and a second end of the metal finger electrode opposite to each other, the width of the metal finger electrode gradually narrows from the first end of the metal finger electrode to the second end of the metal finger electrode, and the width of the metal finger electrode is smaller than the width of the first current blocking layer, and the second current blocking layers are distributed around the first end.

The beneficial effects of this application are as follows:

According to the present application, a chip of a light-emitting diode (LED) is provided, in which an epitaxial layer, a current blocking layer, a transparent conductive layer and a metal finger electrode are sequentially grown on a substrate, wherein the substrate is an $Al_2O_3$ substrate. The current blocking layer includes a first current blocking layer and second current blocking layers, the first current blocking layer is grown along a length direction of the epitaxial layer, the number of the second current blocking layers is multiple, the plurality of second current blocking layers are arranged at one end of the first current blocking layer at intervals and are arranged and grown in a preset shape. The first current blocking layer gradually widens in a direction away from the second current blocking layers. The transparent conductive layer includes a first transparent conductive layer and a second transparent conductive layer, the first transparent conductive layer is grown on the current blocking layer and is at least partially overlapped with the second current blocking layers, and the second transparent conductive layer is grown on the epitaxial layer. In this way, when the current enters from the P electrode, the second current blocking layers can prevent the current from directly entering the P-Gan layer, and the current has to pass through the second transparent conductive layer. That is to say, the transport capacity of the current is increased, the current enters the P-Gan layer through the second transparent conductive layer and the first transparent conductive layer, which increases the brightness of the chip of the LED. The gradually widening configuration of the current blocking layer can improve the diffusion ability of the current of the metal finger along the transparent conductive layer. That is to say, the current blocking layer is designed with a narrow front and a wide rear, which ensures that the current at the terminal end of the metal finger can diffuse along the transparent conductive layer. In addition, the metal finger electrode is grown on the region of the transparent conductive layer on which the current blocking layer is orthographically projected, the metal finger electrode has a first end of the metal finger electrode and a second end of the metal finger electrode opposite to each other, the width of the metal finger electrode gradually narrows from the first end of the metal finger electrode to the second end of the metal finger electrode, the width of the metal finger electrode is smaller than the width of the first current blocking layer, and the second current blocking layers are distributed around the first end of the metal finger electrode, the wide front and narrow rear design adopted by the metal finger electrode increases the width of the first end (front end) of the metal finger electrode, so that the front end of the metal finger electrode can withstand high-density current, and facilitates the diffusion of current, reducing the current reaching the second end (terminal end) of the metal finger electrode. Moreover, during the flowing of the current from the first end of the metal finger electrode to the second end of the metal finger electrode, the current can be sufficiently diffused, so that a certain antistatic effect can be achieved.

BRIEF DESCRIPTION OF THE DRAWINGS

To describe the technical solutions according to the embodiments of this application or the prior art in a clearer way, the accompanying drawings required for describing the embodiments or the prior art will be briefly described hereinafter. Apparently, the accompanying drawings mentioned in the description below depict certain embodiments of this application, and other drawings may also be obtained by one of ordinary skills in the art according to these accompanying drawings without making any effective effort, wherein.

REFERENCE SIGNS

Figure 1:
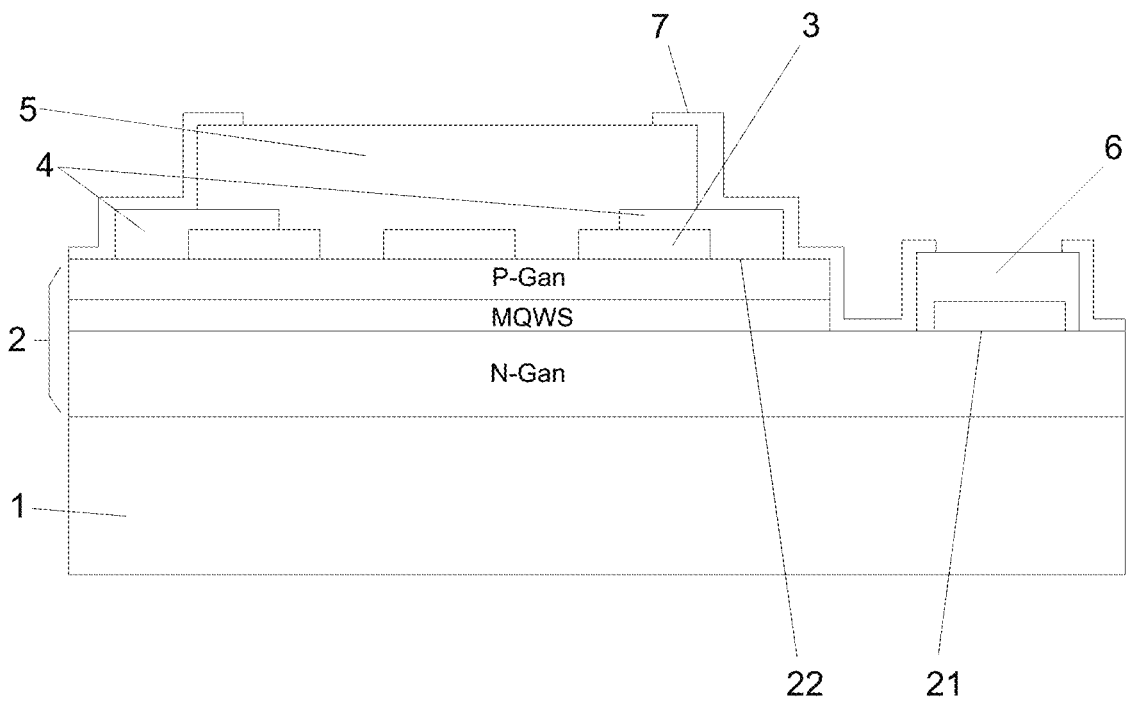
FIG. 1 is a schematic diagram of a chip of a light emitting diode (LED)

1—substrate; 2—epitaxial layer; 21—first epitaxial layer surface; 22—second epitaxial layer surface; 3—current blocking layer; 31—first current blocking layer; 32—second current blocking layer; 33—third current blocking layer; 4—transparent conductive layer; 41—first transparent conductive layer; 42—second transparent conductive layer; 43—recess; 44—protrusion; 5—metal finger electrode; 51—first end of the metal finger electrode; 52—second end of the metal finger electrode; 53—antistatic part; 6—N-type electrode exposed part; 61—first N-type electrode exposed part; 62—second N-type electrode exposed part; 63—N-type electrode solder joint; 7—insulating protection layer.

DETAILED DESCRIPTION OF THE EMBODIMENTS

The technical solutions of this application will be clearly and completely described below in conjunction with the embodiments. Obviously, the embodiments described herein are part of the embodiments of the present application, but not all of them. Based on the embodiments of the present application, all other embodiments obtained by persons of ordinary skill in the art without making creative efforts fall within the protection scope of the present application.

The serial numbers assigned to components herein, such as "first", "second", etc., are only used to distinguish the described objects, and do not have any sequence or technical meaning. The expressions "connect" and "couple" mentioned in this application include direct connection and indirect connection (coupled) unless otherwise specified. It should be understood that the orientation or positional relationships indicated by terms "upper", "lower", "front", "rear", "left", "right", "vertical", "horizontal", "top", "bottom", "inner", "outer", "clockwise", "counterclockwise", etc., in the description of this application are based on the orientation or positional relationships presented in the drawings, and are only for the convenience of describing the present application and simplifying the description, rather than indicating or implying that the referred device or element must have a specific orientation, be constructed and operated in a specific orientation, and thus should not be construed as limiting the application.

In the present application, unless otherwise clearly specified and limited, the expression that a first feature being "on" or "under" a second feature may mean that the first and second features are in direct contact, or that the first and second features are in indirect contact with an intermediary. Moreover, the first feature being "above", "over" or "on" the second feature may mean that the first feature is directly above or obliquely above the second feature, or simply means that the level of the first feature is higher than that of the second feature. The first feature being "below", "under" or "beneath" the second feature may mean that the first feature is directly below or obliquely below the second feature, or simply means that the level of the first feature is lower than that of the second feature.

Some nouns appearing in this application are explained below:

MOCVD, its full name being Metal-orGanic Chemical Vapor Deposition, refers to an organic metal chemical vapor deposition method, specifically a method of growing a conductor film on a base plate. The method is a technology for sending all the reaction substances to a reaction chamber in the form of gas molecules of metallo-organic compounds, using $H_2$ gas as a carrier gas, for thermal decomposition reaction to form a compound semiconductor.

ITO, its full name being Indium Tin Oxide, is a transparent conductive film.

Referring to FIG. 1, the present application provides a chip of a light emitting diode (LED), including a substrate 1, an epitaxial layer 2, a current blocking layer 3, a transparent conductive layer 4, and a metal finger electrode 5.

The substrate 1 may be a sapphire $Al_2O_3$ substrate or a silicon carbide substrate or the like. The epitaxial layer 2, the current blocking layer 3, the transparent conductive layer 4 and the metal finger electrode 5 are grown sequentially on the substrate 1. The aspect ratio of the substrate 1 is greater than or equal to 3:1, so that a chip with such an aspect ratio can be suitable for displaying of screen of a mobile phone and the like.

As shown in FIG. 1, the epitaxial layer 2 may be grown on the substrate 1 by MOCVD vapor deposition. The epitaxial layer 2 includes an N-Gan (N-type gallium nitride) layer, an MQWS (quantum well) layer and a P-Gan (P-type gallium nitride) layer grown sequentially on the substrate 1.

As shown in FIGS. 2, 3, 4 and 9, the current blocking layer 3 is made of $SiO_2$ or $Si_3N_4$, etc., and has a widened design. For example, a width of the current blocking layer 3 is M3, and M3 is 36 μm. The current blocking layer 3 may include a first current blocking layer 31 and a second current blocking layer 32, and the current blocking layer 3 can prevent the current in the metal finger electrode 5 from migrating from the P-Gan layer to the N-Gan layer directly through the transparent conductive layer, thereby improving uniformity of current distribution.

The first current blocking layer 31 is distributed along a length direction of the epitaxial layer 2 and grown on the epitaxial layer 2.

There are a plurality of second current blocking layers 32. For example, the number of the second current blocking layers 32 is an integer value between 2 and 10. The plurality of second current blocking layers 32 are disposed at an end of the first current blocking layer 31. The plurality of second current blocking layers 32 have a preset shape and are distributed at intervals from each other. For example, in a case that the preset shape is circular, the plurality of second current blocking layers 32 may be distributed at intervals in a circumferential direction about the center of the circle, so that the second current blocking layers 32 may form a ring structure at one end of the first current blocking layer 31. In addition, the plurality of second current blocking layers 32 may also be distributed in a rectangle, a trapezoid, etc., which is not limited in this application.

It should be noted that, in a case that the plurality of second current blocking layers 32 are circumferentially distributed to form a ring, a rectangle or a trapezoid, a second current blocking layer 32 is also grown at the center of the preset shape. The second current blocking layers 32 may prevent the current from directly flowing below the P electrode, thereby reducing the current density of the active region below the P electrode and the nearby active region and alleviating the current crowding effect near the P electrode, so that more current will diffuse out, and both the internal quantum efficiency and the light extraction efficiency of the LED will be improved.

The first current blocking layer 31 gradually becomes wider along a direction away from the second current blocking layers 32, that is to say, one end of the first current blocking layer 31 is narrow and the other end thereof is wide. The width of the first current blocking layer 31 may be 16.5~50 um. Preferably, the width of the narrower end of the first current blocking layer 31 is M5, M5 being 17.6 um, and the width of the wider end is M4, M4 being 23.3 um. In this way, the first current blocking layer 31 is capable of preventing the current from dissipating easily, which increases the lateral transport capability of the current along the transparent conductive layer 4, and effectively reduces the proportion of the current directly under the electrode to the total injection current, and at the same time, reduces the thermal effect brought by this part of the current and improves the light extraction efficiency of the LED. Preferably, the width of the first current blocking layer 31 is 16.5~50 um.

Figure 6:
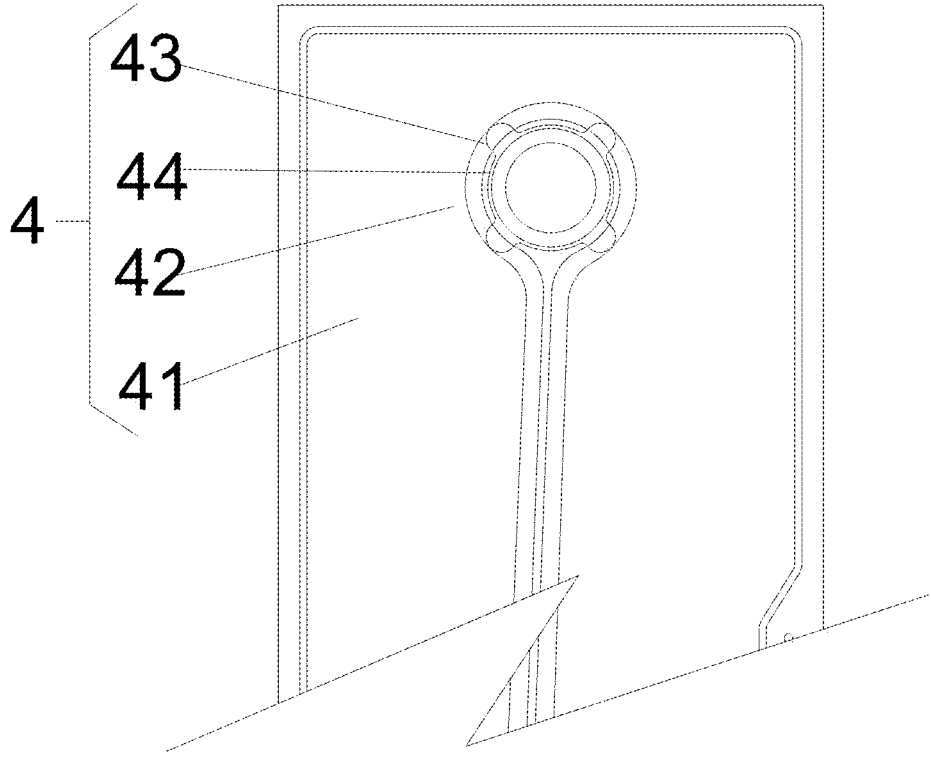
FIG. 6 is a schematic diagram showing a second transparent conductive layer and a current blocking layer in FIG. 5.
Figure 10:
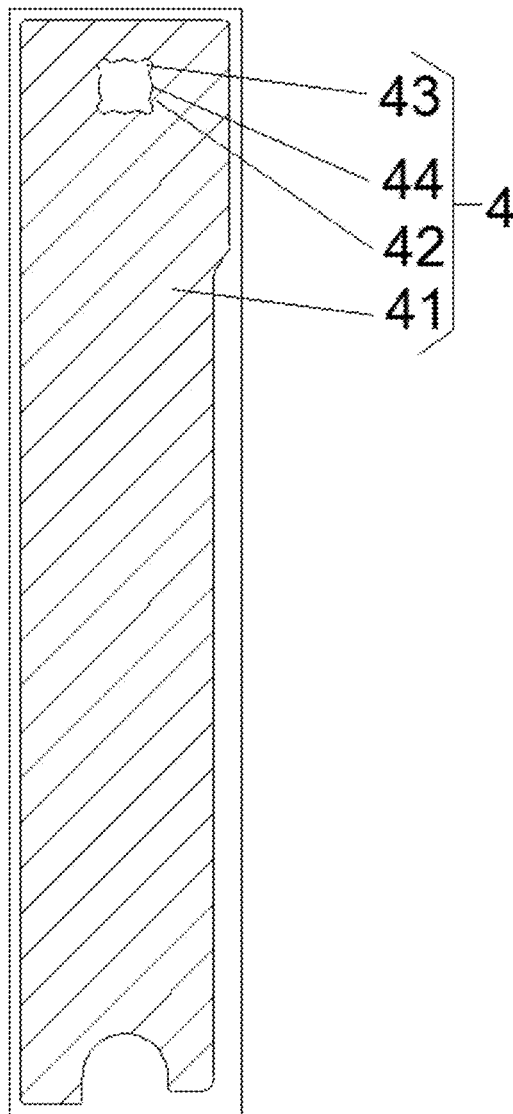
FIG. 10 is a schematic diagram showing a transparent conductive layer of a chip of a LED.

As shown in FIG. 6 and FIG. 10, the transparent conductive layer 4 may be of ITO or the like, and the transparent conductive layer 4 includes a first transparent conductive layer 41 and a second transparent conductive layer 42. The first transparent conductive layer 41 is grown on the current blocking layer 4, and the second transparent conductive layer 42 is grown on the epitaxial layer 2. In this way, current may pass through the first transparent conductive layer 41 to the second transparent conductive layer 42 and diffuse along the second transparent conductive layer 42.

Figure 7:
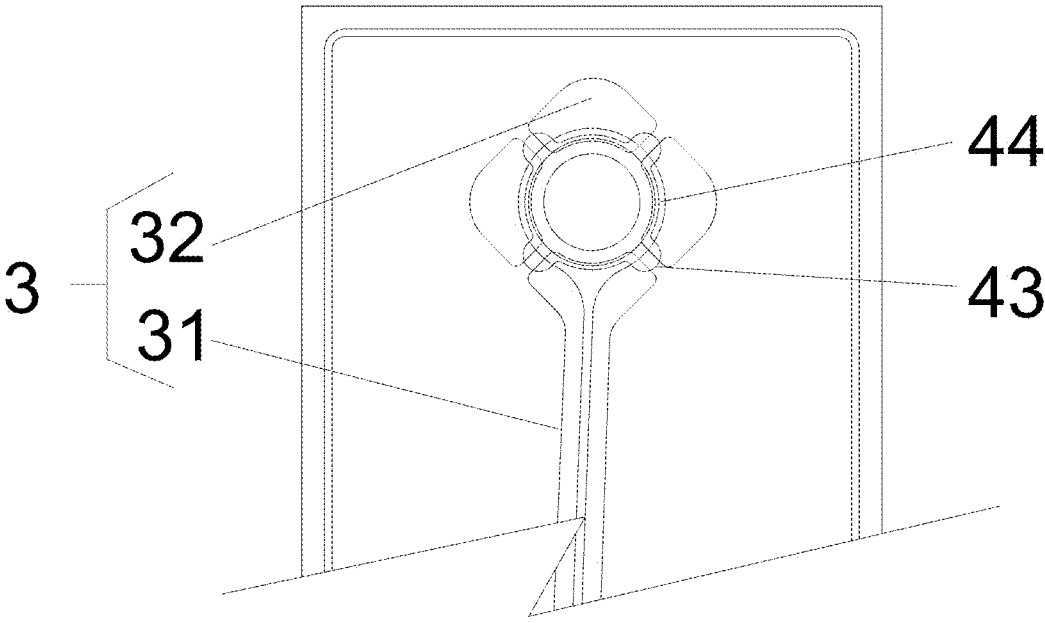
FIG. 7 is a schematic diagram showing that the second transparent conductive layer and the second current blocking layer in FIG. 6 are cross-stacked.

As shown in FIGS. 7 and 10, it should be noted that the first transparent conductive layer 41 may include a hollow conductive ring covering a part of the second current blocking layers 32, so that the hollow part of the conductive ring can be orthographically projected on a region enclosed by the plurality of second current blocking layers 32. Specifically, the conductive ring includes a plurality of inward recesses 43, so that the first transparent conductive layer 41 has a plurality of protrusions 44 surrounding the conductive ring, that is, the recesses 43 are formed away from the center of the conductive ring. In this case, a non-recessed region between two recesses 43 forms a structure of protrusion 44 which is at least partially grown on the second current blocking layer 32. In a case that the second current blocking layers 32 are distributed in a preset shape, the first transparent conductive layer 41 and the second current blocking layers 32 may be arranged in an alternate manner or in a stacked manner. Since the second current blocking layers 32 is capable of preventing part of the current from directly flowing to the P-Gan layer, that is to say, with the plurality of second current blocking layers 32 being distributed in a circumferential direction, part of the current can be diffused along the first transparent conductive layer 41 such that the current is transported along the protrusions 44 of the first transparent conductive layer 41, and is diffused from the first transparent conductive layer 41 to the second transparent conductive layer 42, increasing the amount of transported current. In this way, the brightness of the LED can be increased during the current transportation.

Figure 2:
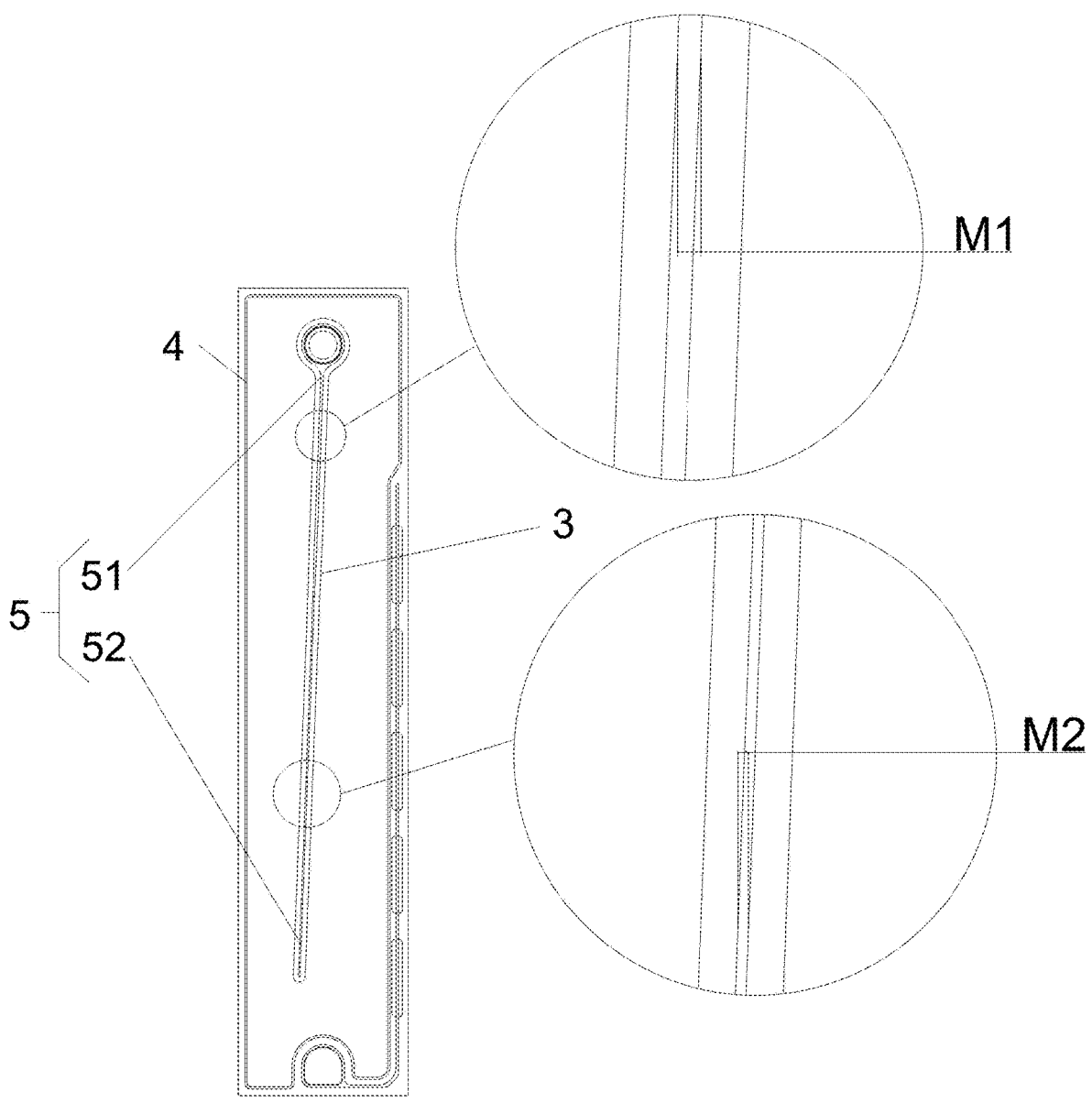
FIG. 2 is a schematic diagram of a metal finger electrode of a chip of a light emitting diode (LED), which has a wide front and a narrow rear.
Figure 3:
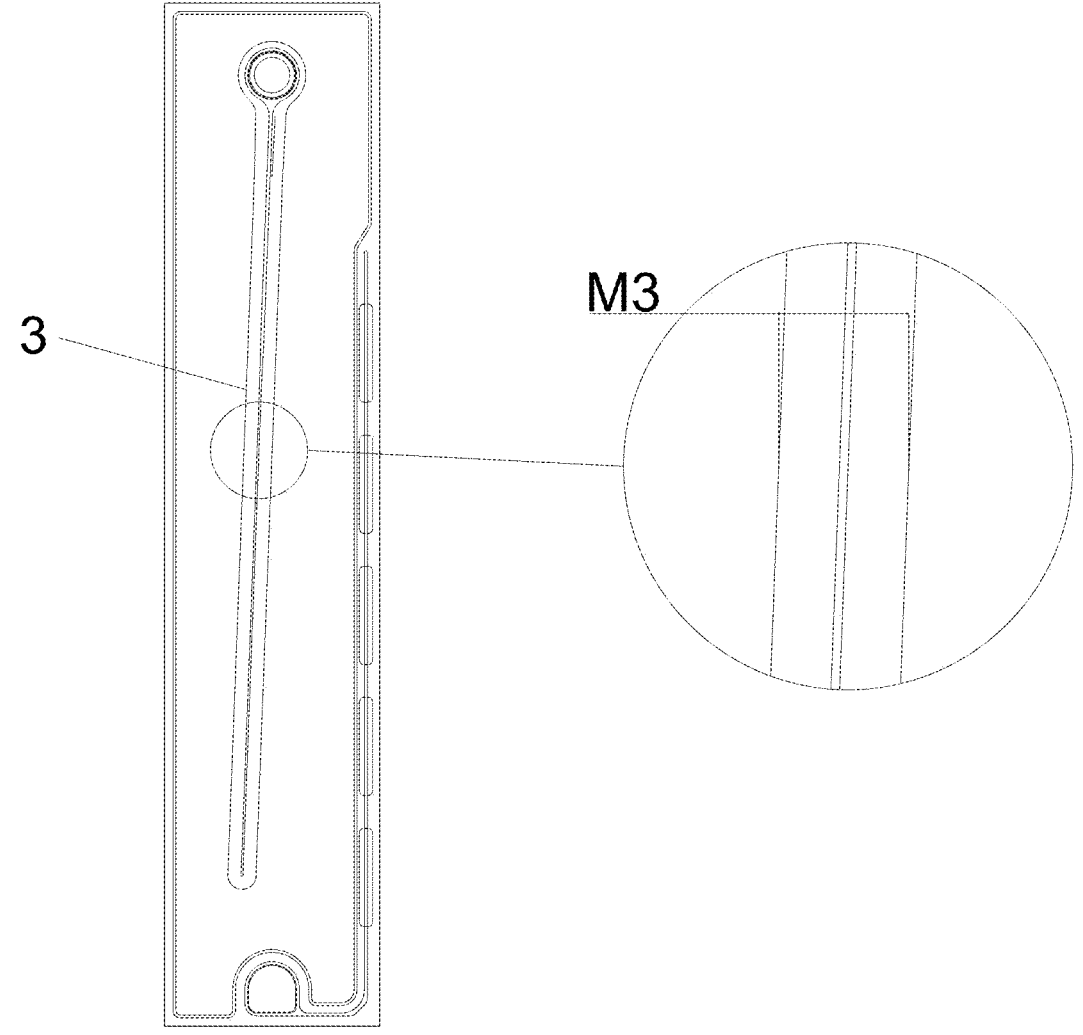
FIG. 3 is a schematic diagram of the current blocking layer of FIG. 2 which is widened.
Figure 4:
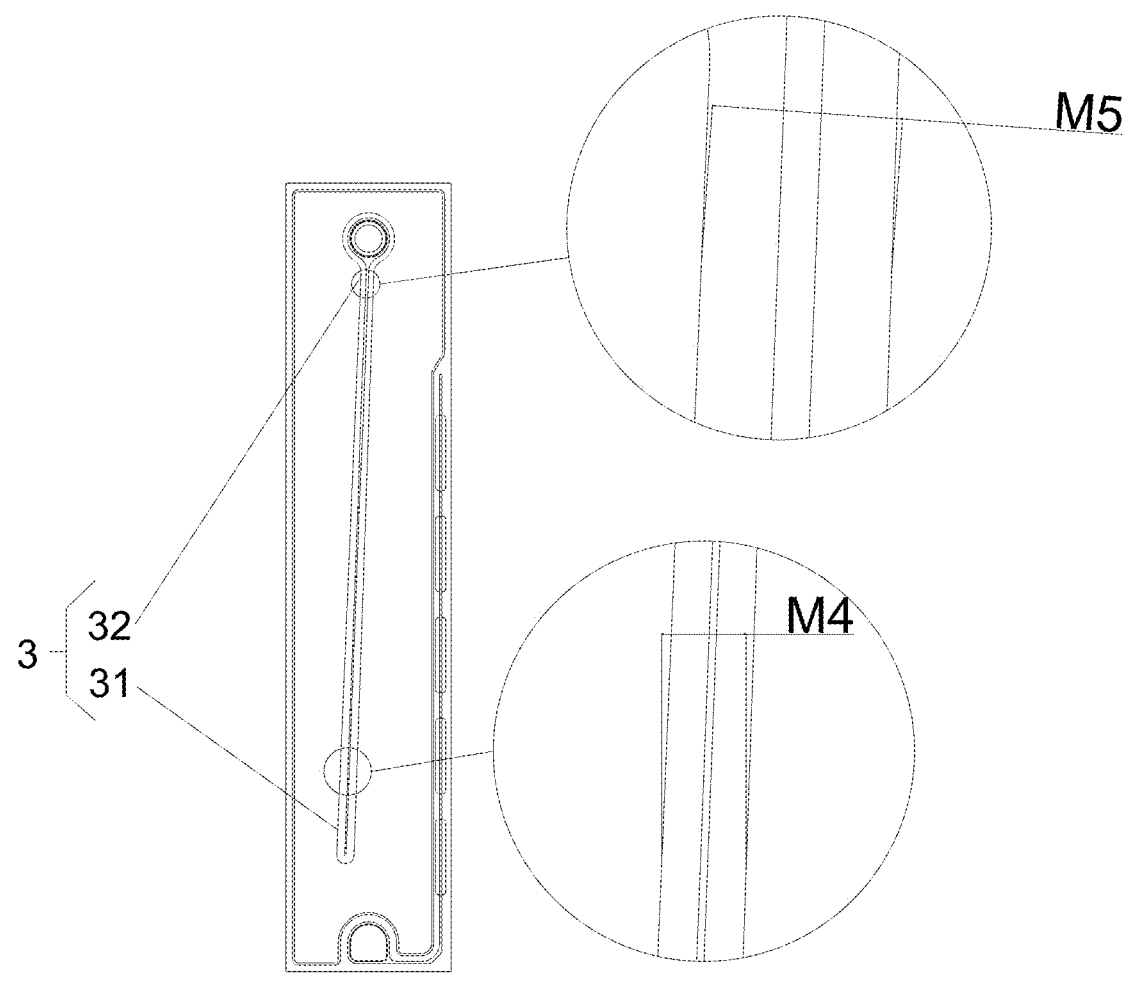
FIG. 4 is a schematic diagram of the current blocking layer of FIG. 3 which has a narrow front and a wide rear.
Figure 11:
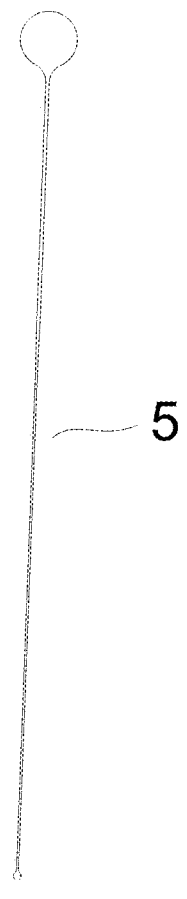
FIG. 11 is a schematic diagram showing a metal finger electrode of a chip of a LED.

As shown in FIGS. 2 and 11, the metal finger electrode 5 is grown on a region of the transparent conductive layer 4 on which the current blocking layer 3 is orthographically projected, and the metal finger electrode 5 has a first end 51 of the metal finger electrode and a second end 52 of the metal finger electrode opposite to each other. The width from the first end 51 of the metal finger electrode to the second end 52 of the metal finger electrode gradually narrows, and the width of the metal finger electrode 5 is smaller than the width of the first current blocking layer 31. The second current blocking layers 32 are distributed around the first end 51 of the metal finger electrode.

The end point of the first end 51 of the metal finger electrode is a P electrode pad, and the P electrode pad is of a circular or polygonal shape, which is not limited in this application. The width between the first end 51 of the metal finger electrode and the second end 52 of the metal finger electrode is 2.5~20 um. Preferably, a width of a middle part of the first end 51 of the metal finger electrode is M1, and M1 is 3.5 um.

It should be noted that the width of the first end 51 of the metal finger electrode is greater than the width of the second end 52 of the metal finger electrode, so that current that can be carried decreases gradually from the first end 51 of the metal finger electrode to the second end 52 of the metal finger electrode. The more current is accommodated at the first end 51 of the metal finger electrode, and the more current is spread. The diffusion of the current is completed when the current reaches the second end 52 of the metal finger electrode.

The area of the P electrode pad at the first end 51 of the metal finger electrode is greater than the width of the metal finger electrode 5, so that when the current reaches the first end 51 of the metal finger electrode through the P electrode, more current can be transported. Then, when the current diffuses along the metal finger electrode 5, the current will increase accordingly, thereby increasing the brightness of the LED.

Figure 5:
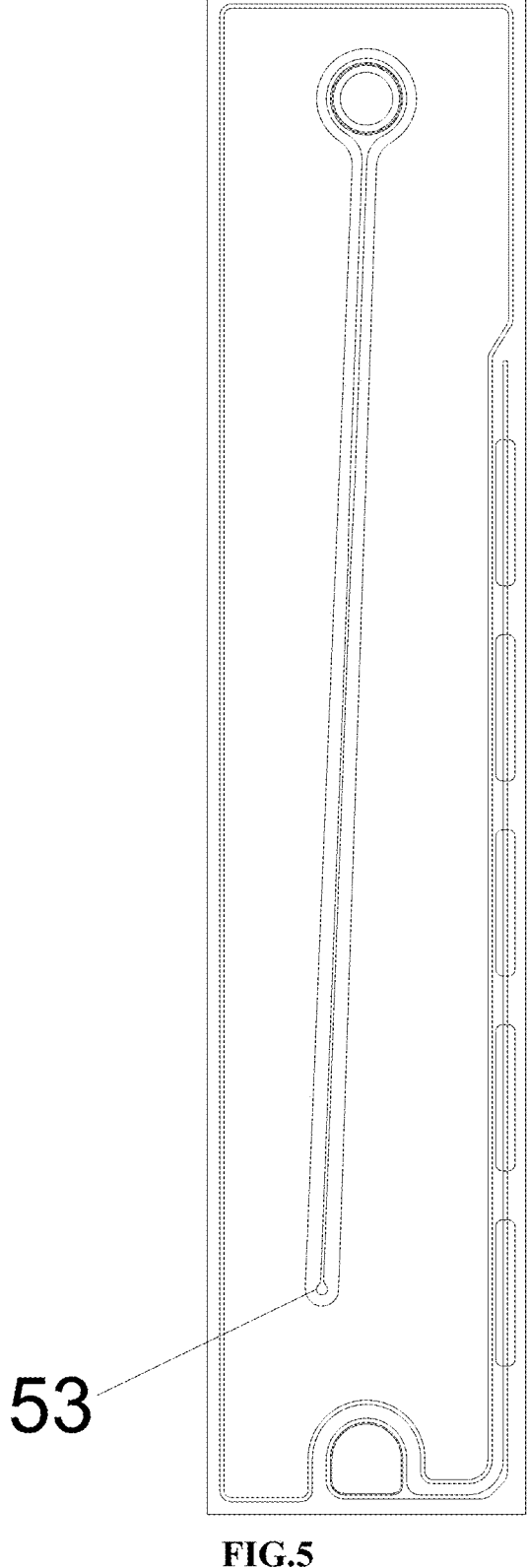
FIG. 5 is a schematic diagram showing that the second end of the metal finger electrode in FIG. 4 has an antistatic part.

As shown in FIGS. 2 and 5, a length between two opposite points at the second end 52 of the metal finger electrode is 2.5~6.5 um. Preferably, the width of the middle part of the second end 52 of the metal finger electrode is M2, and M2 is 2 um. The end point of the second end 52 of the metal finger electrode is provided with an antistatic part 53, and the shape of the antistatic part 53 in an orthographic projection may be a circle or the like, which is not limited in this application. A distance between two opposite points of the antistatic part 53 is greater than the width of the second end 52 of the metal finger electrode. The antistatic part 53 is capable of increasing the resistance of the second end 52 of the metal finger electrode, avoiding or reducing the breakdown of the second end 52 of the metal finger electrode due to the inability of the current to diffuse in time when it reaches the second end 52 of the metal finger electrode, and improving the antistatic capability of the second end 52 of the metal finger electrode.

In this embodiment, a chip of a light emitting diode (LED) employs a structure in which the first current blocking layer 31 gradually widens in a direction away from the second current blocking layers 32 and a plurality of second current blocking layers 32 are circumferentially distributed, to prevent the current in the metal finger electrode 5 from migrating from the P-Gan layer to the N-Gan layer directly through the transparent conductive layer 4, thereby improving the uniformity of current distribution. In addition, the width is gradually narrowed from the first end 51 of the metal finger electrode to the second end 52 of the metal finger electrode, which increases the current transport capacity and improves the brightness of the LED. In addition, the antistatic part 53 provided at the second end 52 of the metal finger electrode can avoid or reduce the risk that the current at the second end 52 of the metal finger electrode fails to diffuse to the transparent conductive layer 4 to form static electricity, which increases the antistatic ability and reduces the probability that the metal finger electrode 5 is broken down.

Figure 8:
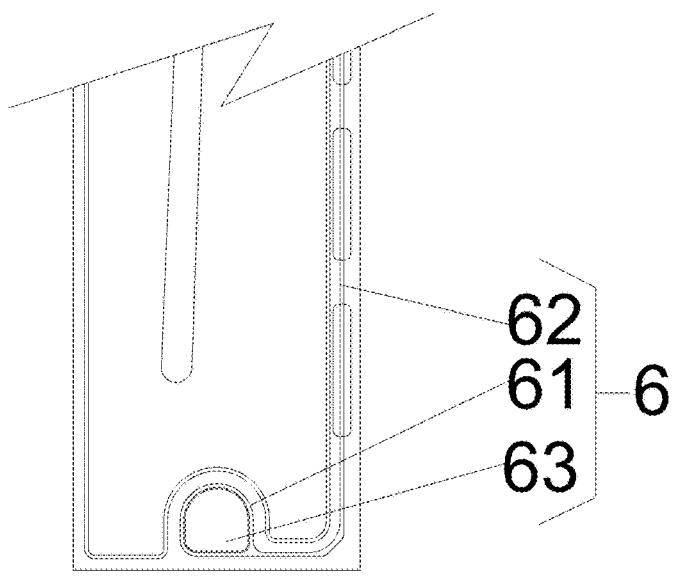
FIG. 8 is a schematic diagram showing an N-type electrode exposed part of a chip of a light emitting diode (LED)
Figure 9:
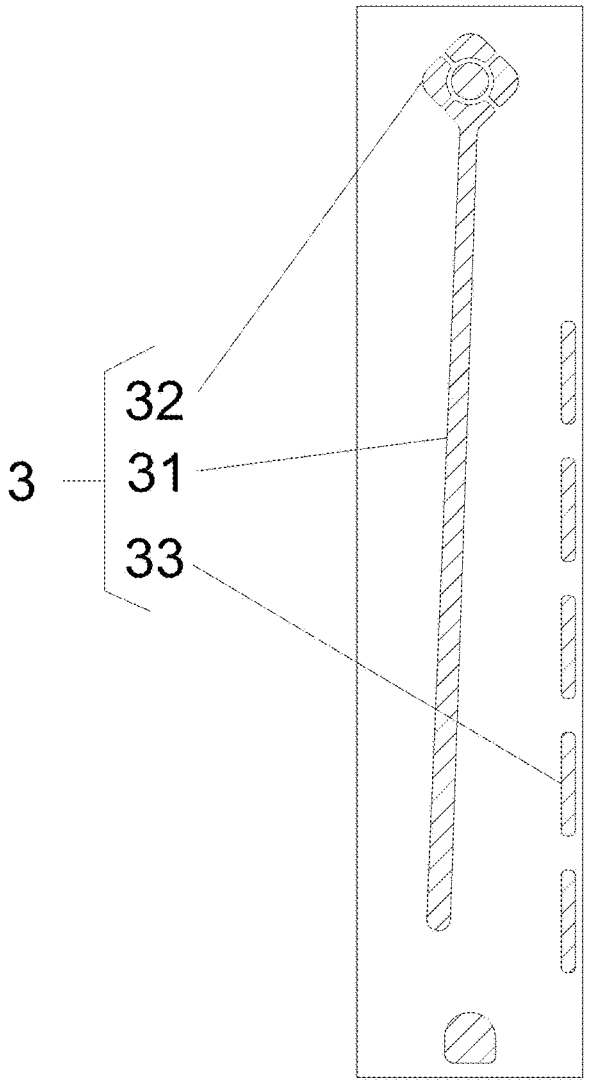
FIG. 9 is a schematic diagram showing a current blocking layer of a chip of a LED.

As shown in FIGS. 1 and 8, in some embodiments, a surface of the epitaxial layer 2 includes a first epitaxial layer surface 21 and a second epitaxial layer surface 22. An N-type electrode exposed part 6 is grown on the first epitaxial layer surface 21 at two adjacent edges of the epitaxial layer 2. The second transparent conductive layer 42 is grown on the second epitaxial layer surface 22, and the current blocking layer 3 further includes a third current blocking layer 33.

The N-type electrode exposed part 6 includes a first N-type electrode exposed part 61 and a second N-type electrode exposed part 62. The first N-type electrode exposed part 61 is arranged in the length direction of the epitaxial layer 2, away from the end portion of the epitaxial layer 2 at the first end 51 of the metal finger electrode. The third current blocking layer 33 is provided at the center of the first N-type electrode exposed part 61.

The second N-type electrode exposed part 62 is disposed along the width direction of the epitaxial layer 2.

It should be noted that the first N-type electrode exposed part 61 and the second N-type electrode exposed part 62 form an "L" shape and are distributed at the edges of the epitaxial layer. An end of the first N-type electrode exposed part 61 is enlarged to form an N-type electrode solder joint 63, and the third current blocking layer 33 is grown on the projection region of the center of the enlarged end. The third current blocking layer 33 can function as a barrier to current, to prevent the current from concentrating at the center of the first N-type electrode exposed part 61, allowing the current to diffuse into the N-type electrode solder joint 63. In addition, the second N-type electrode exposed part 62 can transport current to the N-type electrode solder joint 63.

In this embodiment, the current is transported to the N-type electrode solder joint 63 of the first N-type electrode exposed part 61 via the second N-type electrode exposed part 62, and the third current blocking layer 33 provided at the N-type electrode solder joint 63 can prevent the current from concentrating at the center of the N-type electrode solder joint 63, so that the current can enter the N-type electrode solder joint 63 along the periphery of the N-type electrode solder joint 63, that is, the current circumferentially enters the N-type electrode solder joint 63. This kind of current transport can increase the brightness of the LED.

Figure 12:
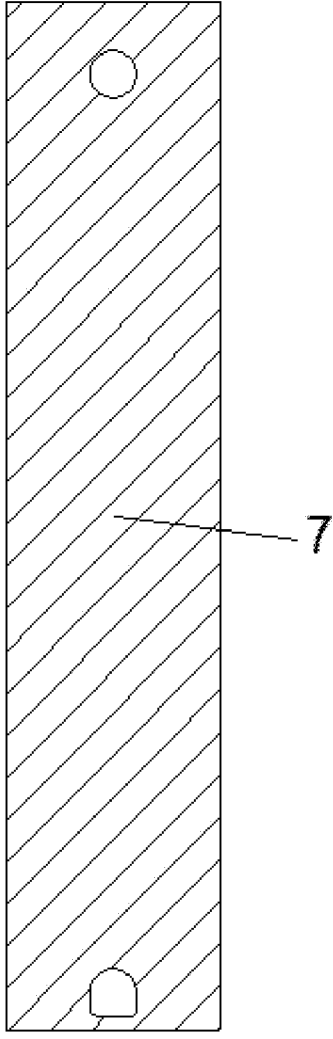
FIG. 12 is a schematic diagram showing an insulating protection layer of a chip of a LED.

As shown in FIG. 12, in some embodiments, the chip of the LED further includes an insulating protection layer 7. The insulating protection layer 7 is grown on the uncovered regions of the epitaxial layer 2, the current blocking layer 3, the transparent conductive layer 4 and the metal finger electrode 5 to protect the surface of the chip.

The insulating protection layer 7 may be made of $SiO_2$, $Si_3N_4$, or the like. The insulating protection layer 7 may be a passivation protection layer.

In some embodiments, the metal finger electrode 5 includes an adhesion layer, a structural layer and a conductive layer arranged in sequence.

The adhesion layer is made of Cr, Ni or Ti, which is convenient to grow on the current blocking layer 3.

The structural layer is made of Al, Cr, Ti, Pt or Ni, and the structural layer forms a connecting layer between the lower adhesion layer and the upper conductive layer.

The conductive layer is made of Cu, Au, Sn or AuSn, and is used for transporting the electric current.

It should be noted that the adhesion layer, the structural layer and the conductive layer are sequentially grown in a stacked manner.

As shown in FIG. 1, corresponding to the foregoing embodiment of the chip of the LED, the present application also provides an embodiment of a manufacturing method of the chip of the LED. The manufacturing method of the chip of the LED comprises:

growing an epitaxial layer on a substrate 1;

growing a current blocking layer 3 on the epitaxial layer;

growing a transparent conductive layer 4 on the current blocking layer 3; and growing a metal finger electrode 5 on the transparent conductive layer 4 corresponding to an orthographical projection position of the current blocking layer 3; wherein, the substrate 1 is $Al_2O_3$ substrate;

the current blocking layer 3 includes a first current blocking layer 31 and a second current blocking layers 32. the first current blocking layer 31 is grown along a length direction of the epitaxial layer, the number of the second current blocking layers 32 is multiple, the plurality of second current blocking layers 32 are arranged at one end of the first current blocking layer 31 at intervals, and the plurality of second current blocking layers 32 are arranged and grown in a preset shape;

the width of the first current blocking layer 31 gradually widens from one end of the first current blocking layer 31 close to the second current blocking layers 32 to the other end thereof away from the second current blocking layers 32;

the transparent conductive layer 4 includes a first transparent conductive layer 41 and a second transparent conductive layer 42, the first transparent conductive layer 41 is grown on the current blocking layer 3 and is at least partially overlapped with the second current blocking layers 32, and the second transparent conductive layer 42 is grown on the epitaxial layer; and the metal finger electrode 5 is grown on a region of the transparent conductive layer 4 on which the current blocking layer 3 is orthographically projected, the metal finger electrode 5 has a first end 51 of the metal finger electrode and a second end 52 of the metal finger electrode opposite to each other, the width of the metal finger electrode 5 gradually narrows from the first end 51 of the metal finger electrode to the second end 52 of the metal finger electrode, and the width of the metal finger electrode 5 is smaller than the width of the first current blocking layer 31, and the second current blocking layers 32 are distributed around the first end 51 of the metal finger electrode.

The above embodiments are only specific implementations of the present invention, and the descriptions thereof are relatively specific and detailed, which, however, should not be construed as limitations to the protection scope of the present application. It should be noted that, several modifications and improvements may be made by those skilled in the art without departing from the concept of the present application, and all the modifications and improvements fall within the protection scope of the present application.

What is claimed is:

1. A chip of a LED, comprising:

a substrate, and an epitaxial layer, a current blocking layer, a transparent conductive layer and a metal finger electrode grown sequentially on the substrate, wherein the current blocking layer includes a first current blocking layer grown along a length direction of the epitaxial layer and a second current blocking layers, a number of the second current blocking layers is multiple, the plurality of second current blocking layers are arranged at one end of the first current blocking layer at intervals, and the plurality of second current blocking layers are arranged and grown in a preset shape;

the first current blocking layer gradually widens along a direction away from the second current blocking layers;

the transparent conductive layer includes a first transparent conductive layer and a second transparent conductive layer, the first transparent conductive layer is grown on the current blocking layer and is at least partially overlapped with the second current blocking layers, and the second transparent conductive layer is grown on the epitaxial layer; and the metal finger electrode is grown on a region of the transparent conductive layer on which the current blocking layer is orthographically projected, the metal finger electrode has a first end of the metal finger electrode and a second end of the metal finger electrode opposite to each other, a width of the metal finger electrode gradually narrows from the first end of the metal finger electrode to the second end of the metal finger electrode, the width of the metal finger electrode is smaller than a width of the first current blocking layer, and the second current blocking layers are distributed around the first end of the metal finger electrode, and wherein an end point of the second end of the metal finger electrode is provided with an antistatic part which widens a width of the end point of the second end of the metal finger electrode.

2. The chip of the LED according to claim 1, wherein an end point of the first end of the metal finger electrode is a P electrode pad, the P electrode pad having a circular or polygonal shape, and a width of a connecting part between the first end of the metal finger electrode and the second end of the metal finger electrode is 2.5~20 um.

3. The chip of the LED according to claim 1, wherein the first transparent conductive layer comprises a hollow conductive ring, and the conductive ring covers part of the second current blocking layers, so that a hollow part of the conductive ring can be orthographically projected onto a region enclosed by the plurality of second current blocking layers.

4. The chip of the LED according to claim 3, wherein the conductive ring includes a plurality of inward recesses, so that the first transparent conductive layer has a plurality of protrusions surrounding the conductive ring, and the protrusions are at least partially grown on the second current blocking layers.

5. The chip of the LED according to claim 4, wherein the current blocking layer is made of $SiO_2$ or $Si_3N_4$, and the width of the first current blocking layer is 16.5~50 um.

6. The chip of the LED according to claim 1, wherein a surface of the epitaxial layer includes a first epitaxial layer surface and a second epitaxial layer surface, an N-type electrode exposed part is grown on the first epitaxial layer surface at two adjacent edges of the epitaxial layer, the second transparent conductive layer is grown on the second epitaxial layer surface, and the current blocking layer further includes a third current blocking layer, wherein the N-type electrode exposed part includes a first N-type electrode exposed part and a second N-type electrode exposed part, the first N-type electrode exposed part is arranged in the length direction of the epitaxial layer, away from an end portion of the epitaxial layer at the first end of the metal finger electrode, and the third current blocking layer is provided at a center of the first N-type electrode exposed part, and the second N-type electrode exposed part is disposed along a width direction of the epitaxial layer.

7. The chip of the LED according to claim 1, further comprising an insulating protection layer, wherein the insulating protection layer is grown on uncovered regions of the epitaxial layer, the current blocking layer, the transparent conductive layer and the metal finger electrode.

8. The chip of the LED according to claim 1, wherein the metal finger electrode includes an adhesion layer, a structural layer and a conductive layer arranged in sequence, wherein the adhesion layer is made of Cr, Ni or Ti;

the structural layer is made of Al, Cr, Ti, Pt or Ni; and the conductive layer is made of Cu, Au, Sn or AuSn.

9. A manufacturing method of a chip of a LED, wherein the manufacturing method is applied to the chip of the LED according to claim 1, and the manufacturing method comprises:

growing the epitaxial layer on the substrate;

growing the current blocking layer on the epitaxial layer;

growing the transparent conductive layer on the current blocking layer; and growing the metal finger electrode at an orthographical projection position of the current blocking layer on the transparent conductive layer; wherein, the current blocking layer includes the first current blocking layer and the second current blocking layers, wherein the first current blocking layer is grown along the length direction of the epitaxial layer, and a number of the second current blocking layers is multiple, the plurality of second current blocking layers being arranged at one end of the first current blocking layer at intervals and being arranged and grown in a preset shape;

the first current blocking layer gradually widens along a direction away from the second current blocking layers;

the transparent conductive layer includes the first transparent conductive layer and the second transparent conductive layer, the first transparent conductive layer is grown on the current blocking layer and is at least partially overlapped with the second current blocking layers, and the second transparent conductive layer is grown on the epitaxial layer; and the metal finger electrode is grown on the region of the transparent conductive layer on which the current blocking layer is orthographically projected, the metal finger electrode has the first end of the metal finger electrode and the second end of the metal finger electrode opposite to each other, the width of the metal finger electrode gradually narrows from the first end of the metal finger electrode to the second end of the metal finger electrode, the width of the metal finger electrode is smaller than the width of the first current blocking layer, and the second current blocking layers are distributed around the first end of the metal finger electrode, and wherein the end point of the second end of the metal finger electrode is provided with the antistatic part which widens the width of the end point of the second end of the metal finger electrode.

5

* * * * *